United States Patent [19]

Brune

[11] Patent Number: 4,878,700

[45] Date of Patent: Nov. 7, 1989

[54] CABINET STIFFENER

[75] Inventor: Johannes Brune, Erlangen, Fed. Rep. of Germany

[73] Assignee: Siemens Aktiengesellschtaft, Munich, Fed. Rep. of Germany

[21] Appl. No.: 197,613

[22] Filed: May 23, 1988

[30] Foreign Application Priority Data

Jul. 6, 1987 [DE] Fed. Rep. of Germany ....... 3722296

[51] Int. Cl.$^4$ ................................. E05C 3/04
[52] U.S. Cl. ..................................... 292/241; 52/291; 292/204; 292/257
[58] Field of Search .................................. 49/394, 396; 312/257 SK, 215, 222; 52/291, 222; 403/343, 350, 367, 409.1, 447; 292/DIG. 21, 257, 213, 218, 202, 204, 241

[56] References Cited

U.S. PATENT DOCUMENTS

| | | | |
|---|---|---|---|
| 2,722,721 | 11/1955 | Carlow | 52/291 |
| 3,479,076 | 11/1969 | Schallenn | 292/257 |
| 3,715,531 | 2/1973 | Keeley | 292/241 |
| 4,288,116 | 9/1981 | Schlienger | 292/257 |
| 4,813,726 | 3/1989 | Ravinet | 292/204 |

FOREIGN PATENT DOCUMENTS 2736163 2/1979 Fed. Rep. of Germany .
8101241 1/1981 Fed. Rep. of Germany .
2479640 3/1981 France .

Primary Examiner—Gary L. Smith
Assistant Examiner—Eric K. Nicholson
Attorney, Agent, or Firm—Kenyon & Kenyon

[57] ABSTRACT

A stiffening device for an electronics cabinet has at least two angle struts that are each formed by profile bars. The profile bars enclose an obtuse angle between them and are pivoted in the upper and lower corner regions of the cabinet frame rack. The angle struts are coupled to each other in a frictional, form-locking manner at their vertices by a tightening assembly when in a closed position. A formed fit over a large area is obtained when tightening the angle struts by attaching the profile bars of each angle strut to a door. The pivots of each angle strut are used for the pivots of the corresponding door. The tightening assembly includes a hole of radius $R_1$ arranged at the vertex of one angle strut and a hole of radius $R_2$ arranged at the vertex of the other angle strut. The hole dimensions are such that $R_2$ is greater than $R_1$. A tightening latch is arranged in both holes. The tightening latch has a first disc of radius $R_1$ pivoted in the corresponding hole of radius $R_1$. A second disc protrudes, in the closed door position, into the hole with the radius $R_2$. The second disc has two circular sectors, of which one has the radius $R_2$ and the other, the radius $R_3$. Rotation of the tightening latch causes the angle struts to tighten against each other.

8 Claims, 5 Drawing Sheets

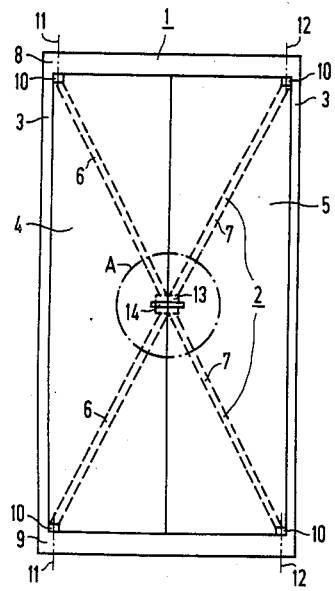

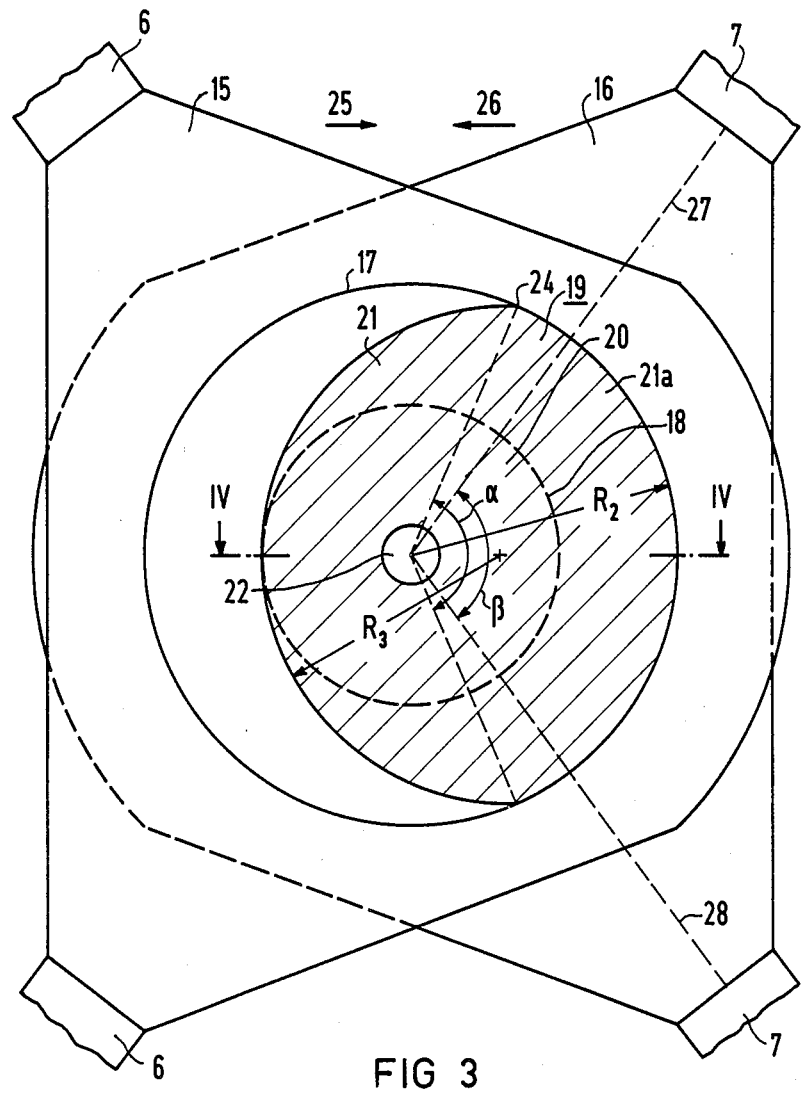
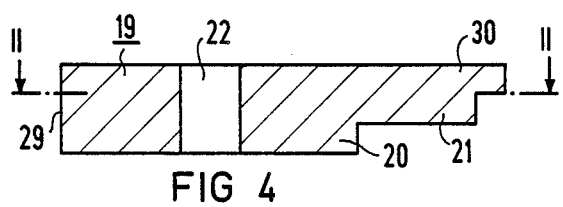
FIG 3
FIG 4

CABINET STIFFENER

FIELD OF THE INVENTION

This invention relates to the field of cabinet stiffeners and, more particularly, to an electronics cabinet stiffening device having a frame rack. The cabinet includes cover panels fastened to the frame and at least two swinging doors located at either the front of the cabinet or both the front and back of the cabinet.

BACKGROUND OF THE INVENTION

It is known to stabilize and stiffen cabinets using two angle struts formed of profile bars. The profile bars used in each angle strut are joined at an end to enclose an obtuse angle. The opposite end of the profile bar legs, i.e. the ends of the angle strut, are pivoted in the upper and lower corner region of the frame rack about an axis parallel to the lateral edges of the frame rack. The angle struts, in their closed condition, are coupled to each other at their vertex region by a tightening connector. The coupling is achieved in a frictional, form-locking manner using the tightening connector as an eccentric.

The above type of cabinet stiffening device is described in German Design Patent 81 01 241. In the German Patent, the angle struts of the stiffening device are spaced away from the cabinet doors. A toggle-type of fastener provides a tightening lock by fastening a bolt at the vertex of the angle struts. A locking piece having an eccentrically arranged lateral surface part is pivoted to merge the surface part into a plane contact surface with an angle strut to tighten the device. With the tightening lock closed, the contact surface rests against the vertex of the angle strut and the two angle struts are pressed together.

A problem associated with the above described stiffening device is that it cannot be handled in a simple manner. Further, there is no assurance that the stiffening device is tightened when the door is closed. Also, in the tightened condition, it is more desirable to obtain a form-fitting closure over a larger area than is achieved in the above described device.

SUMMARY OF THE INVENTION

The present invention overcomes these problems in a stiffening device having the profile bars of each angular strut secured to a cabinet door. The pivots of each angle strut also function as the pivots for the associated door. A tensioning assembly is provided for the two angle struts. A drill hole having a radius $R_1$ is formed at the vertex of one angle strut and a drill hole of radius $R_2$ is formed at the vertex of the other strut. The radius $R_2$ is larger than the radius $R_1$. A tensioning latch comprises two discs attached to each other. One disc has a radius $R_1$ and is rotatably supported in the drill hole having a radius $R_1$. The second disc extends, in the angle strut closed condition, into the hole with the radius $R_2$. The second disc is made of two circular sectors: one having a radius $R_2$ and the other having a radius $R_3$. The center of the circular sector with the radius $R_2$ is located on a straight line through the center of the disc with the radius $R_1$.

The present invention combines the angle struts with the cabinet doors. Therefore, the usable space or net width of the cabinet is increased. Further, simpler handling of the stiffening device is achieved as the door is pretensioned and locked by a simple rotary motion of the tensioning latch.

Furthermore, it is assured that in the closed door position, the stiffening device is tightened and locked by a 180° rotation of the tensioning latch. This ensures that the circular sector having the radius $R_2$ is engaged with the hole of the corresponding angle strut and that both angle struts are braced against each other.

It is a further advantage of the invention that in a closed door, untightened position, the two drill holes are aligned at a point on their circumference. This allows the tensioning latch to have a simple form.

Additionally, it is advantageous for the tensioning latch disc of radius $R_1$ and the second disc's circular sector of radius $R_2$ to have the same center.

Further, it is particularly advantageous, for tightening the two angle struts, to have the tensioning latch pivot located at the intersection of the legs of both angle struts when the angle struts are in the closed door, untightened position.

It is yet another advantage for the deformability of the tensioning latch to make the disc radius $R_3$ smaller than the disc radius $R_2$ and larger than the radius $R_1$.

In a preferred embodiment, the angle at the center of the circular sector having the radius $R_2$ is made greater than the obtuse angle enclosed by the legs of the angle strut. Therefore, in the tightened condition, a large contact area over the angle is obtained allowing for a particularly reliable lock.

In further embodiment, the circular sector having radius $R_2$ includes a projection which covers a part of the angular strut with the hole having a radius $R_2$ when in the closed door, tightened condition. The tightening device is thereby additionally secured against accidentally snapping open.

These and other advantages will be realized by the device of the present invention as explained in detail by the given examples.

DESCRIPTION OF THE FIGURES

FIG. 3 is a detailed view of FIG. 2 in the tightened condition.

FIG. 4 is a cross-sectional view of the tightening latch along IV—IV of FIG. 3.

DETAILED DESCRIPTION

Figure 1:
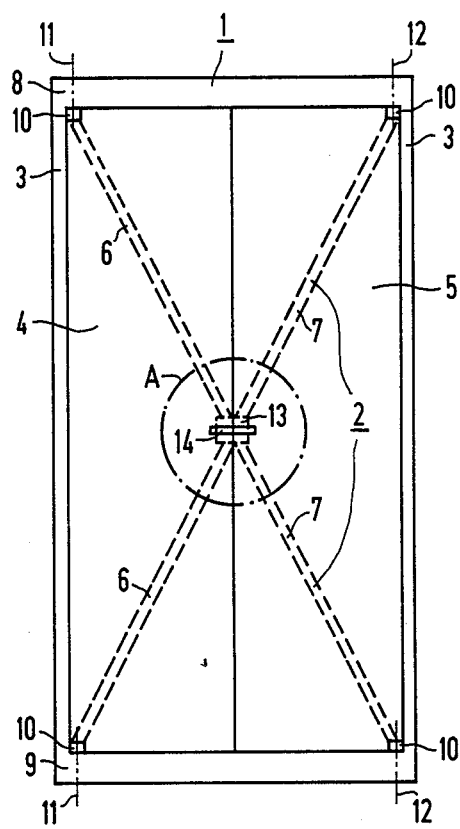
FIG. 1 is a side view of a cabinet using the present invention.

Referring to FIG. 1, there is shown a side view of an electronics cabinet having the stiffening device 2 of the present invention. The electronics cabinet 1 is constructed with a frame rack 3. Covering panels are provided for the cover and side surfaces of the frame rack 3. The cabinet 1 has doors 4 and 5 on the front side and, optionally, on the back side as indicated in FIG. 1. The stiffening device 2 is constructed with a similarly designed pair of angle struts 6 and 7. The angle struts 6, 7 each have two profile bars which are joined at an end forming an obtuse angle between them. Each door 4 or 5 has a pair of profile bars, e.g. a hat profile bar or channel bar, secured to it by welding or otherwise, to form a unit. The ends of the two angle strut legs are pivoted in pillow blocks 10 at the upper and lower corners 8 and 9, respectively, of the frame rack 3. The pillow blocks 10 pivot about an axis 11, 12 which is parallel to the lateral edge parts of the frame rack 3. The pivots of the angle struts 6 and 7 also function as the pivots for the doors 4 and 5. For example, the profile bars forming the angle struts can be provided with a spherical head rotatably held in a corresponding bearing bushing to provide the pivoting motion.

By mechanically securing the angle struts 6 and 7 to their corresponding doors 4 and 5, the net usable width of the electronics cabinet is increased. In addition, this ensures that the tightening assembly and the doors close together, thereby also tightening the stiffening device.

The two angle struts 6 and 7 are frictionally and form-fittingly coupled together at their vertex area indicated by dashed circle A, in a tightening assembly joint 13. The tightening assembly joint 13 includes a handle portion 14, the rotation of which tightens the doors 4 and 5. When the handle 14 is rotated, a latch bar can additionally lock the doors. Therefore, a simple mode of operation is obtained as the door is pretensioned and locked with one rotary motion of the handle 14. The dashed circle region A is shown in detail in FIGS. 2-7 and is discussed in connection with these figures.

Figure 2:
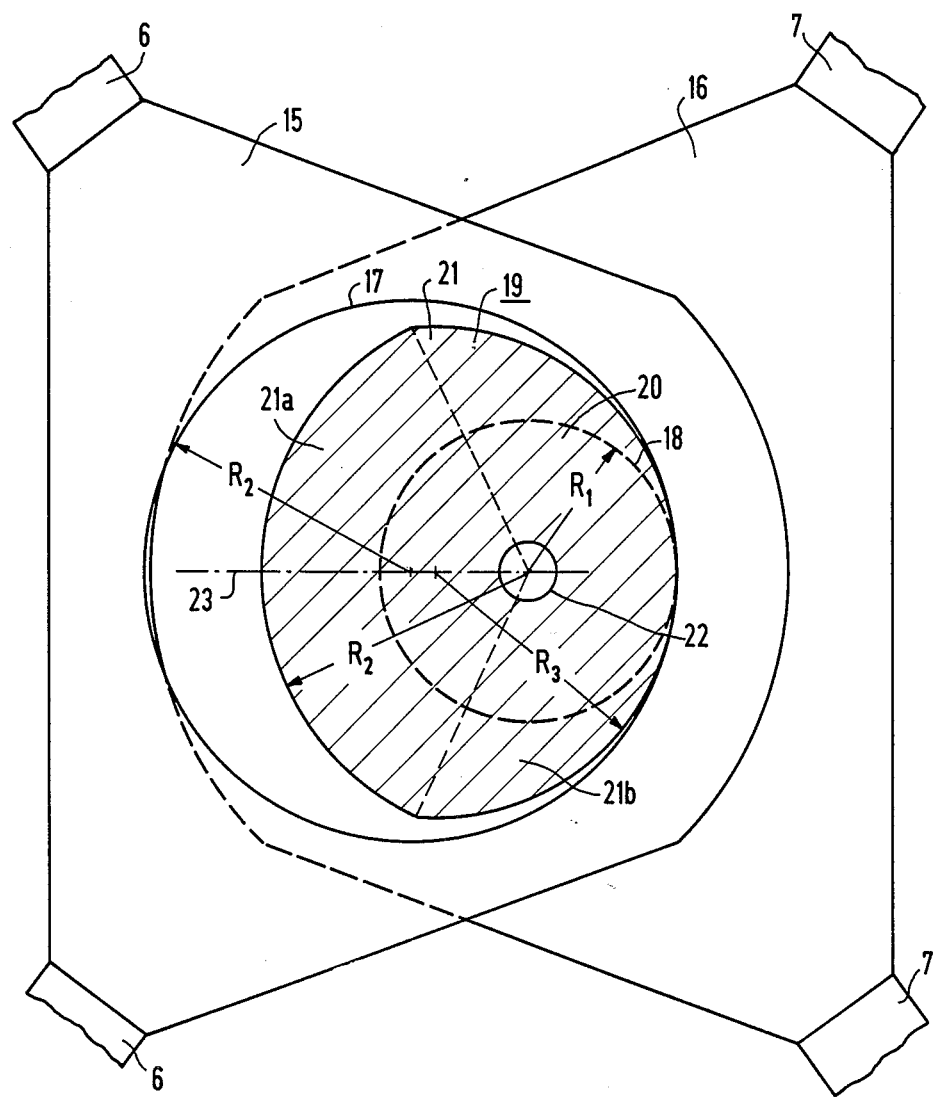
FIG. 2 is a detailed view of the preferred embodiment for the tightening assembly indicated by circle A in FIG. 1.

Referring to FIG. 2, there is shown in detail a specific design of the dashed circle region A in the stiffening device 2. A preferred embodiment of the tightening assembly joint 13 is also shown in the figure. FIG. 2 shows the tightening assembly joint 13 with the angle struts 6 and 7 in the closed yet untightened position. The ends of the profile bars forming the vertex of the angle struts 6 and 7 are each secured to a formed piece 15 and 16, respectively. The formed pieces 15 and 16 are at least partially attached to the corresponding doors 4 and 5. Drill holes 17 and 18 are provided in the formed pieces 15 and 16, respectively. The hole 18 of formed piece 16 has a radius $R_1$, and the hole 17 of formed piece 15 has a radius $R_2$. The radius $R_2$ is made larger than the radius $R_1$.

Arranged in the two holes 17 and 18 is a tightening latch 19 as shown in a cross sectional view along line II—II in FIG. 4. The tightening latch 19 comprises two discs 20 and 21 attached to each other. Disc 20 has a radius $R_1$ and is rotatably supported in the hole 18. The disc 21 is composed of two circular sectors 21a and 21b. The circular sector 21a has a radius $R_2$ and circular sector 21b has a radius $R_3$. Both radii $R_2$ and $R_3$ are thus greater than radius $R_1$. Additionally, tightening latch 19 has a hole 22 which can be used to provide an extra fastener, i.e. a handle 14. The hole 22 is located at the center of disc 20 having the radius $R_1$.

The centers of both drill holes 17 and 18 and the circular sector 21a having the radius $R_2$ are located on a straight line 23. In the preferred embodiment, both the center of hole 18 and the center of circular sector 21a coincide. It is further preferred though not required that the center of circular sector 21b be located on the straight line 23. Also, it is preferred that the radius $R_3$ be made smaller than the radius $R_2$ to simplify the form of the tightening latch 19.

FIG. 3 illustrates the tightening assembly joint 13 of FIG. 2 in a tightened condition. The tightening latch 19 has been rotated 180° from its position in FIG. 2. During the tightening rotation process, the edge 24, i.e. where the circular sector 21a abuts the circular sector 21b of disc 21, engages the circumference of hole 17. Continuing the rotation of the tightening latch 19 forces the formed parts 15 and 16 to move in the direction of arrows 25 and 26 until the stiffening device is fully tightened. Upon rotating the tightening latch 180°, the two angle struts 6 and 7 are tightened against each other with their lines of force 27 and 28 leading through the center of hole 18. In the fully tightened condition, the entire circumference of circular sector 21a having radius $R_2$ rests against the circumference of large hole 17.

In the preferred embodiment, a large form fit is obtained by making the angle $\alpha$, defining the arc of the circular sector 21a, larger than the angle $\beta$ which is formed by the intersection of force lines 27 and 28. This large form fit ensures a stable tightening of the two angle struts 6 and 7.

Referring to FIG. 4, there is shown a cross-sectional view through the tightening latch 19 along the line IV—IV of FIG. 3. The circular discs 20 and 21 have a common edge 29. The common edge corresponds to the fact that holes 17 and 18 are aligned with each other at a point on their circumference in the closed yet untightened condition. Attached to disc 21, opposite disc 20, is another disc 30 which projects beyond the disc 21 in the circular sector region 21a. In the tightened condition, the projection 30 rests on formed part 15 to prevent the accidental opening of the tightening assembly joint 13.

In the prferred embodiment, as shown in FIGS. 2 through 4, the difference between the radius $R_2$ and the radius $R_1$ governs the degree of tension created in the angle struts when they are in the closed and tightened position. The angle $\alpha$ is the governing factor for maximum tightening during the rotation of the tightening latch 19.

Figure 5:
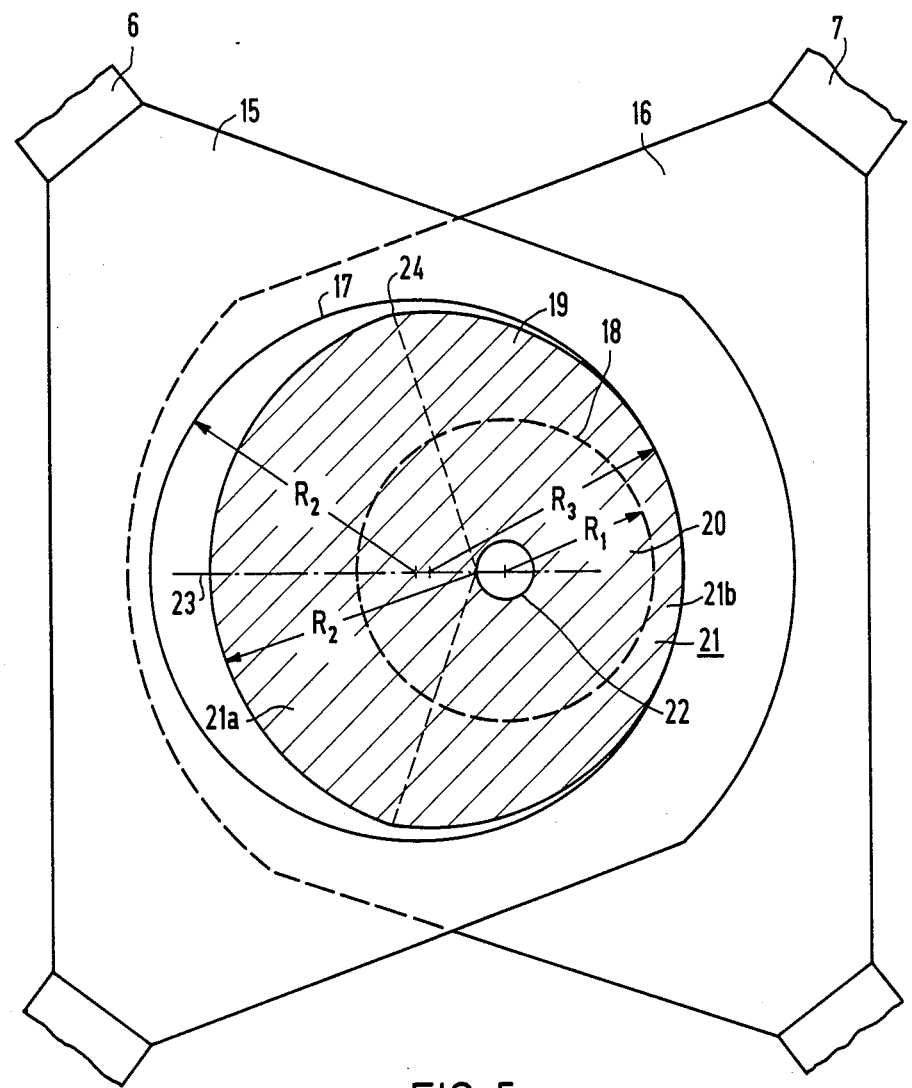
FIG. 5 is a detailed view of another embodiment of the tightening assembly.
Figure 6:
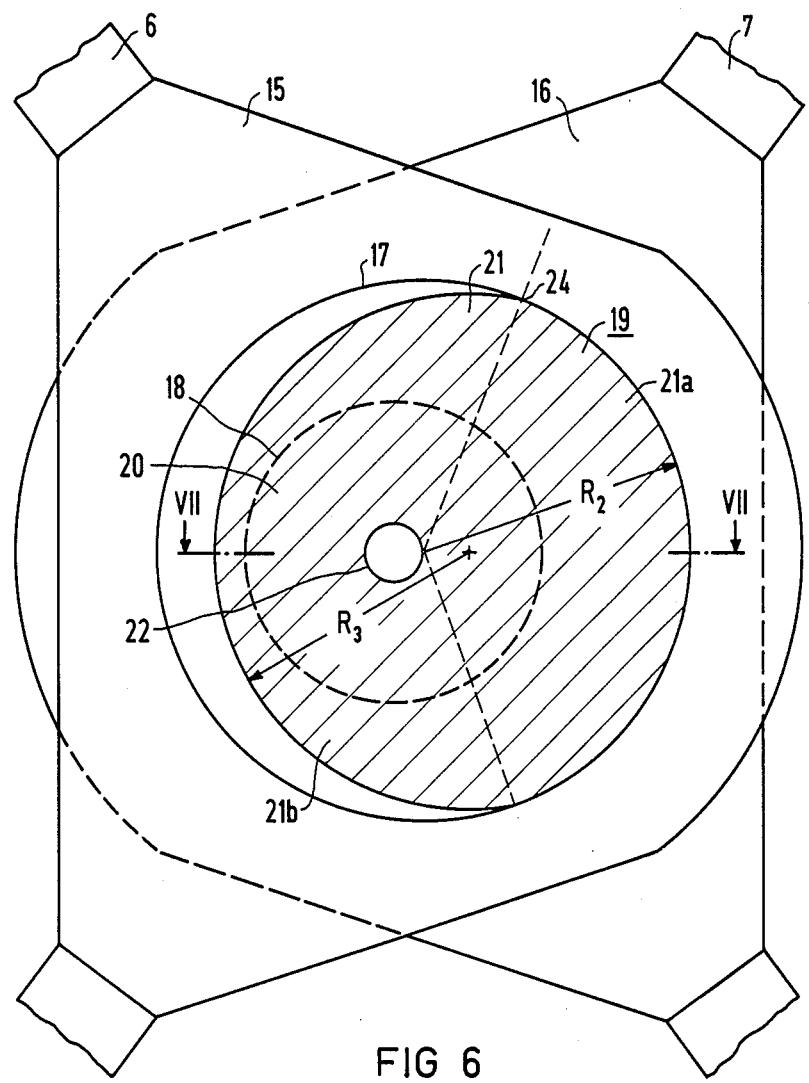
FIG. 6 is a detailed view of the embodiment of FIG. 5 in the tightened condition.
Figure 7:
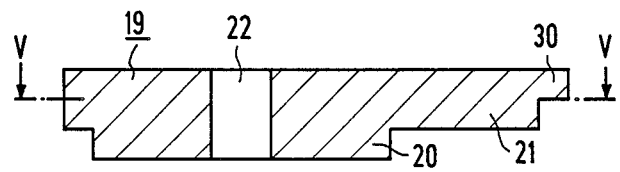
FIG. 7 is a cross-sectional view of the tightening latch along line VII—VII of FIG. 6.

FIGS. 5 through 7 show another embodiment of the tightening assembly according to the invention. In this embodiment, where the numeric designations correspond to those of FIGS. 2 to 4, the center of circular sector 21a having radius $R_2$, does not coincide with the center of circular disc 20. However, the centers of both drill holes 17 and 18 and circular sector 21a lie on a straight line 23.

In this embodiment, the function and operation of the tightening latch 19 remains the same as that in the preferred embodiment of FIGS. 2 to 4. As shown in FIG. 7, however, the shape of the tightening latch 19 differs from the tightening latch 19 shown in FIG. 4. The shape of the tightening latch 19 in FIG. 7 makes the latch slightly more complicated to fabricate.

What is claimed is:

1. A stiffening device for a cabinet having a first and a second angle strut, a frame rack and at least two doors, each angle strut being formed from at least two profile bars coupled to each other to create a vertex enclosing an obtuse angle, each of said angle struts pivoting at their ends in an upper and lower corner region of said frame rack about an axis parallel to a lateral edge of siad frame rack, said angle struts further coupling to each other in a frictional and form-locking manner at their vertex, the improvement comprising:

(a) the first angle strut having a first hole of a first radius $R_1$ located at the vertex of said first angle strut and the second angle strut having a second hole of a second radius $R_2$ located at the vertex of said second angle strut, said second radius $R_2$ being greater than said first radius $R_1$; and (b) a tightening assembly associated with the angle struts and acting as an eccentric at their vertex comprising a tightening latch having a first and a second disc coupled to each other, the first disc having a first radius $R_1$ and pivoting in the first hole having the first radius $R_1$, the second disc lying in the plane of the second hole when the angle struts are coupled to each other, the second disc further being made of a first circular sector with a second radius $R_2$ and a second circular sector with a third radius $R_3$, the center of the first circular sector being located on a straight line perpendicular to said axis through a center of said first hole.

2. A stiffening device according to claim 1 wherein each one of said angle struts is coupled to one of the doors, the pivots of said angle struts being the pivots of said doors whereby the usable net width of the cabinet is increased.

3. A stiffening device according to claim 1 wherein said first and second holes align with each other at a point on their circumference when the angle struts are in a coupled but untightened position.

4. A stiffening device according to claim 3 wherein the first disc with the first radius $R_1$ and the first circular sector with the second radius $R_2$ have the same center.

5. A stiffening device according to claim 4 wherein the tightening latch has a pivot located at the intersection of the first and second angle struts when the angle struts are in the tightened position.

6. A stiffening device according to claim 5 wherein said third radius $R_3$ is smaller than said second radius $R_2$ and greater than said first radius $R_1$.

7. A stiffening device according to claim 6 wherein the first circular sector has a first arc angle greater than the obtuse angle formed between the profile bars of an angle strut.

8. A stiffening device according to claim 7, further comprising a projection coupled to said first circular sector, said projection covering a part of said second angle strut when the tightening latch is in the tightened condition.

* * * * *